United States Patent
Lerner et al.

(10) Patent No.: US 8,208,507 B2
(45) Date of Patent: Jun. 26, 2012

(54) FEEDBACK CONTROL FOR HEATED TOSA

(75) Inventors: Victor Jacob Lerner, Foster City, CA (US); Charles Steven Joiner, Cupertino, CA (US); YongShan Zhang, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/338,765

(22) Filed: Dec. 18, 2008

(65) Prior Publication Data

US 2010/0158057 A1  Jun. 24, 2010

(51) Int. Cl.
*H01S 3/04* (2006.01)
*H01S 3/13* (2006.01)
*H04B 1/00* (2006.01)

(52) U.S. Cl. .............. 372/34; 372/29.01; 372/29.02; 398/135; 398/140

(58) Field of Classification Search ............ 372/34, 372/36, 38.1, 38.02, 29.01, 29.02; 398/135, 398/140

See application file for complete search history.

(56) References Cited

U.S. PATENT DOCUMENTS

| | | | | |
|---|---|---|---|---|
| 6,590,686 | B1* | 7/2003 | Sekiya et al. | 398/183 |
| 7,356,057 | B2* | 4/2008 | Deng et al. | 372/34 |
| 2003/0152390 | A1* | 8/2003 | Stewart et al. | 398/135 |
| 2005/0185684 | A1* | 8/2005 | Stewart et al. | 372/29.02 |
| 2006/0263092 | A1* | 11/2006 | Hosking et al. | 398/135 |
| 2007/0195838 | A1* | 8/2007 | Gibson et al. | 372/36 |
| 2008/0080575 | A1* | 4/2008 | Murry | 372/34 |
| 2008/0267233 | A1* | 10/2008 | Deng et al. | 372/34 |
| 2009/0010655 | A1* | 1/2009 | Schulz et al. | 398/136 |

* cited by examiner

*Primary Examiner* — Jessica Stultz
*Assistant Examiner* — Phillip Nguyen
(74) *Attorney, Agent, or Firm* — Maschoff Gilmore & Israelsen (57) ABSTRACT

A closed loop system for controlling laser temperature without the need for additional sensors or other hardware. Embodiments utilize an existing automatic power feedback loop and existing sensors to determine the temperature of a TOSA based on changes in laser bias current, thus avoiding the need for the additional hardware. The automatic power feedback loop will modify the laser bias current as the temperature of the TOSA changes. That is, as the temperature increases, the amount of laser bias current is increased and as the temperature decreases, the amount of laser bias current is decreased. Thus, the laser bias current may be used as feedback for the laser temperature control. Accordingly, when the transceiver module drops below a predetermined temperature, a laser heater current may be controlled to thereby maintain the same laser bias current as at the preset temperature.

20 Claims, 6 Drawing Sheets

FEEDBACK CONTROL FOR HEATED TOSA

BACKGROUND

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

Lasers typically have an optimal operating temperature range, which is typically around room temperature. For optimal performance of the laser, the laser temperature needs to be controlled to some range. Operation outside of the temperature range can reduce the laser's performance to the point it is unusable. For example, a decrease in performance of the laser's turn-on time, turn-off time, optical modal properties and optical power may be experienced. For semiconductor lasers such as a VCSELs, DFB lasers, or EMLs, the lasing mode is typically locked by the laser feedback system, which may include, for example, DBR mirrors, or gratings. The gain, i.e., the amplification of the light, is provided by the laser active region. Generally at cold temperatures, the laser active region wavelength shifts to a shorter side, also known as a blue shift, due to semiconductor material properties. Therefore at cold temperatures, the gain region peak wavelength may be significantly shorter than the lasing wavelength. This may give rise to a host of problems for laser operation.

Illustratively, operation at colder temperatures may cause the laser's reaction speed, the speed at which the laser changes from high power output to low power output, to be decreased, thus lengthening the laser's reaction time and reducing the communication bandwidth. Cold temperatures may also cause a laser intended to operate in a single mode fashion to operate in a multi-mode fashion. Cold operating temperatures may also reduce the amount of power that a laser can output. Despite these limitations at these temperatures, there is increased demand for laser modules that operate in wider temperature ranges and at colder and hotter temperatures.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The principles of the present invention relate to an optical transceiver module that includes a laser, a sensor configured to monitor an amount of laser bias current provided to the laser, a heating element configured to heat the laser, and control circuitry coupled to the heating element and the sensor. The control circuitry is configured to adjust an amount of current provided to the heating element when the sensor determines that the laser bias current being provided to the laser is below a predetermined value, the predetermined value being indicative of a desired temperature. Providing current to the heating element causes an increase in the operating temperature of the laser.

The principles of the present invention also relate a method for an optical transceiver to control the temperature of a laser. The method includes determining that a laser bias current provided to a laser is less than a predetermined value. The laser bias current is indicative of laser temperature and the predetermined laser bias current value is indicative of a desired operating temperature. The method also includes adjusting an amount of current provided to a heating element configured to heat the laser. The optical transceiver comprises a laser, a sensor configured to monitor an amount of laser bias current provided to the laser, a heating element configured to heat the laser, and a control module coupled to the heating element and the sensor.

The principles of the present invention further relate to an optical transceiver module that includes a laser, a sensor configured to monitor an amount of laser bias current provided to the laser, a heating element configured to heat the laser, and control circuitry coupled to the heating element and the sensor. The optical transceiver is configured to determine a relationship between the temperature of the laser and a laser bias current that is provided to the laser, determine that the laser is not at a desired operating temperature based on a measured laser bias current value and the relationship between the temperature of the laser and laser bias current that is provided to the laser, and cause that a current to the heating element be provided or adjusted to thereby change the temperature of the laser until a laser current value is measured that indicates that the laser is at the desired operating temperature.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

The principles of the present invention provide for a closed loop system for controlling laser temperature without the need for additional sensors or other hardware. Embodiments utilize an existing automatic power feedback loop and existing sensors to determine the temperature of a TOSA based on changes in laser bias current, thus avoiding the need for the additional hardware. The automatic power feedback loop will modify the laser bias current as the temperature of the TOSA changes. That is, as the temperature increases, the amount of laser bias current is increased and as the temperature decreases, the amount of laser bias current is decreased. Thus, the laser bias current may be used as feedback for the laser temperature control. Accordingly, when the transceiver module drops below a predetermined temperature, a laser heater current may be controlled to thereby maintain the same laser bias current as at the preset temperature.

Figure 1A:
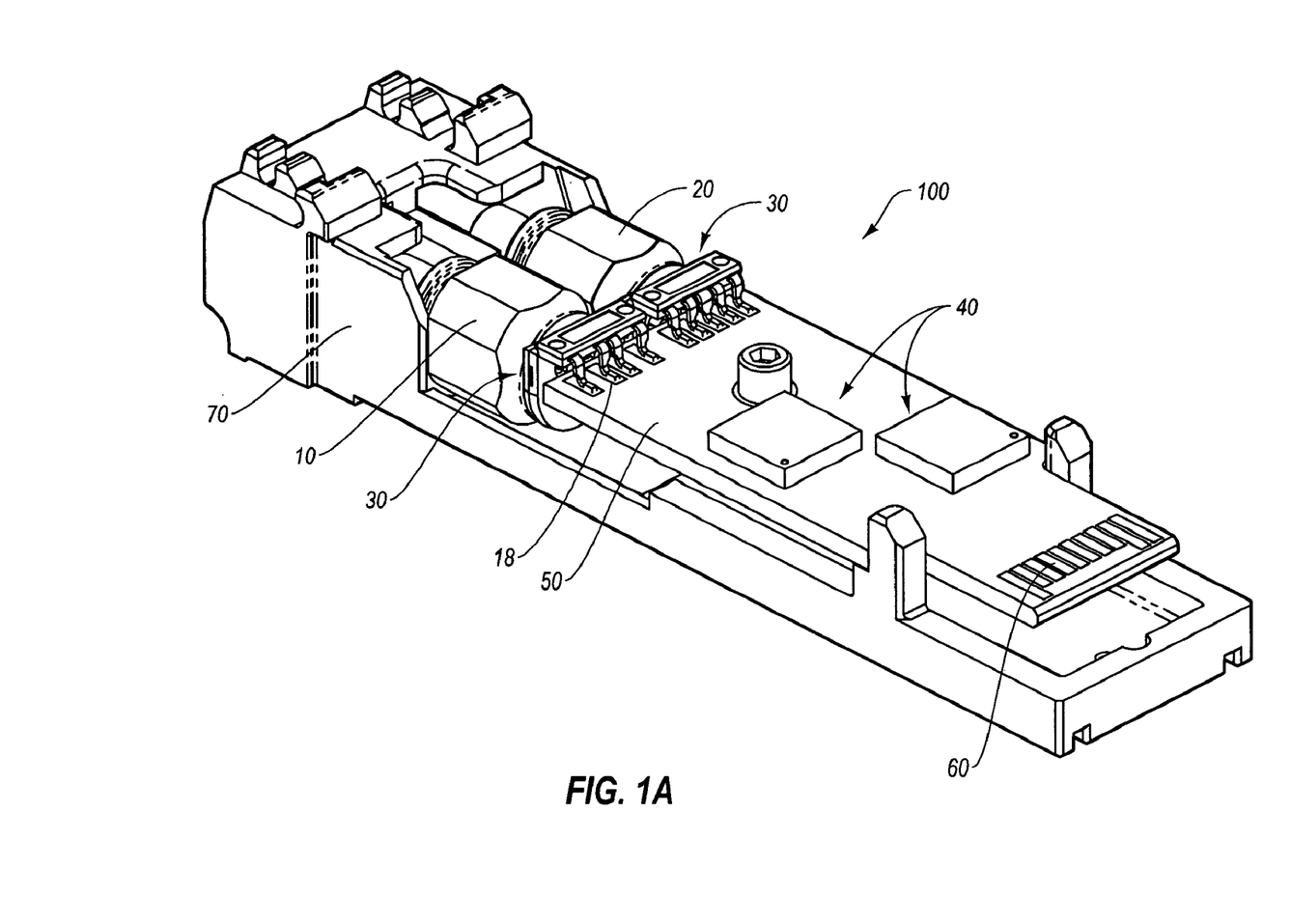
FIG. 1A is a perspective view of an example of an optical transceiver module.

Reference is first made to FIG. 1A, which depicts a perspective view of an example optical transceiver module ("transceiver"), generally designated at 100, for use in transmitting and receiving optical signals in connection with an external host that is operatively connected, in one embodiment, to a communications network. As shown, the transceiver shown in FIG. 1 includes various components, including a Receiver Optical Subassembly ("ROSA") 10, a Transmitter Optical Subassembly ("TOSA") 20, electrical interfaces 30, various electronic components 40, such as a laser-driver/post-amplifier and a control module for example, and a printed circuit board 50 which supports the electronic components 40.

In the illustrated embodiment, two electrical interfaces 30 are included in the transceiver 100, one each used to electrically connect the ROSA 10 and the TOSA 20 to a plurality of conductive pads located on the PCB 50. The electronic components 40 are also attached to the PCB 50. An edge connector 60 is located on an end of the PCB 50 to enable the transceiver 100 to electrically and mechanically interface with a host (not shown). In addition, the above-mentioned components of the transceiver 100 are partially housed within a housing 70. Though not shown, some embodiments include a shell that cooperates with the housing 70 to define an enclosure for components of the transceiver 100.

Figure 1B:
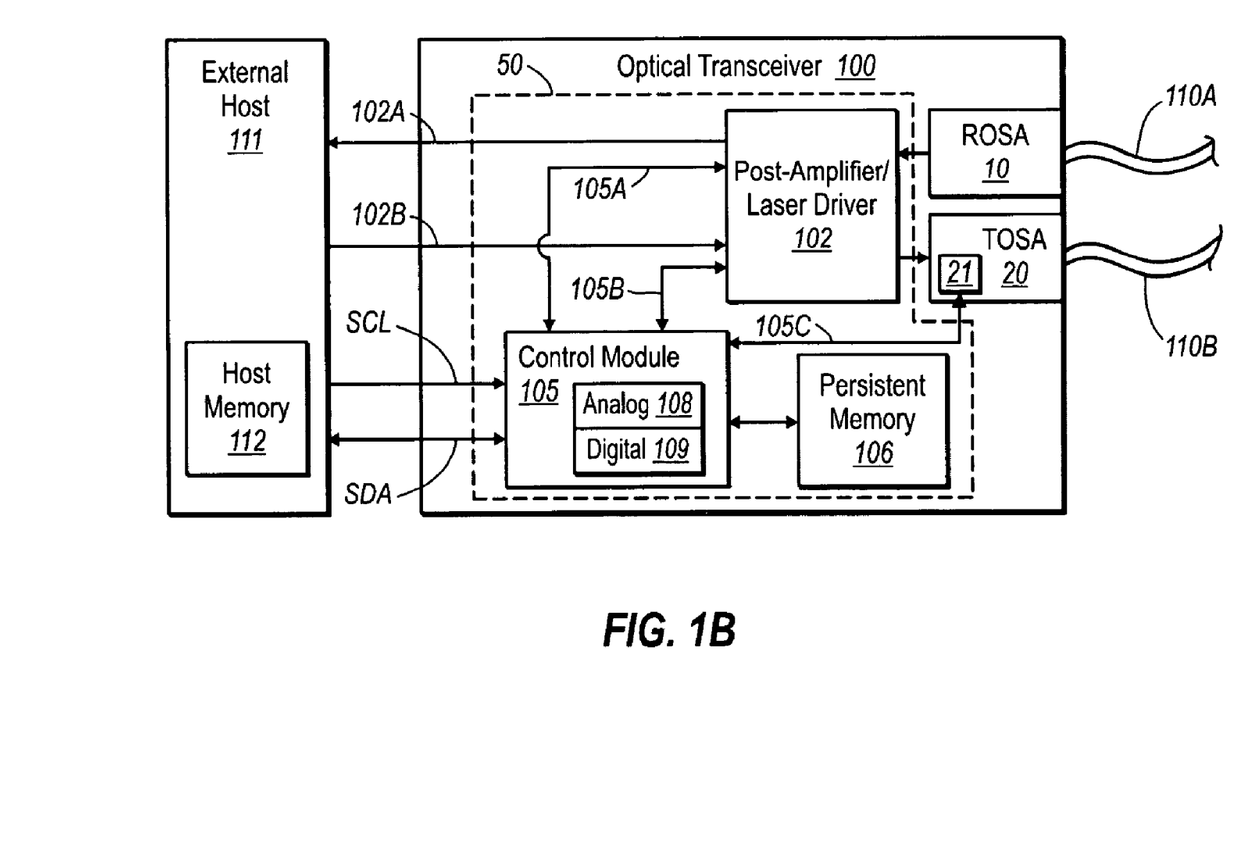
FIG. 1B is a simplified block view showing various aspects of the optical transceiver module of FIG. 1A.

Reference is now made to FIG. 1B, which is a simplified block diagram of an example of an optical transceiver, denoted at 100 in FIG. 1A, depicting various physical and operational aspects of the transceiver. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including 1 Gbit/s, 2 Gbit/s, 4 Gbit/s, 10 Gbit/s, 40 gbit/s, 10 Gbit/s as well as even higher data rates. Furthermore, the embodiments described herein can be implemented in optical transceivers conforming with any of a variety of different form factors, examples of which include, but are not limited to, XFP, SFP and SFF, as well as a variety of different communication protocols, examples of which include, but are not limited to, GiGE, SONET, and Fibre Channel.

With continuing reference to FIG. 1B, and with reference as well to FIG. 1A, transceiver 100 includes printed circuit board ("PCB") 50 on which the various electronic components of the transceiver are mounted. One such component is a control module 105. Control module 105 is connected to an integrated post-amplifier/laser driver ("PA/LD") 102 by connections 105A and 105B. These connections allow control module 105 to monitor the operation of the post-amplifier/laser driver 102 as will be described in more detail to follow. Control module 105 is connected to a persistent memory 106, which stores microcode for configuring control module 105 and is also used to store operational parameters. The control module 105 is also able to communicate with an external host 111 as depicted by the Serial Data line (SDA) and Serial Clock line (SCL).

Transceiver 100 includes both a transmit path and a receive path, both of which will now be described. The receive path includes ROSA 10, which includes a photodiode that transforms an incoming optical data signal into an electrical data signal. The electrical data signal is then provided to a post-amplifier portion of PA/LD 102. The post-amplifier amplifies and otherwise processes the electrical data signal and provides the electrical data signal to the external host 111 via connection 102A.

For the transmit path, external host 111 generates an electrical data signal and provides the electrical data signal to a laser driver portion of PA/LD 102 via connection 102B. The laser driver processes the electrical data signal and drives the TOSA 20, which causes a laser included in the TOSA 20 to emit an optical data signal.

The operation of transceiver 100 will now be described in further detail. In operation, the optical transceiver 100, receives an optical data signal from a fiber 110A via the ROSA 10. The ROSA 10 transforms the received optical data signal into an electrical data signal. The ROSA 10 then provides the resulting electrical data signal to a post-amplifier. In the illustrated embodiment, the post amplifier is consolidated with the laser driver as an integrated PA/LD 102. As such, the PA/LD 102 resides on a single integrated circuit chip and is included as a component, together with the other electronic components 40, some of which are further described below, on PCB 50. In other embodiments, the post amplifier and laser driver are implemented as separate components on the PCB 50.

The post-amplifier portion of the PA/LD 102 amplifies the received electrical data signal and provides the amplified data signal to external host 111 over signal path 102A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the host 111 for transmission onto a fiber 10B. Specifically, the laser driver portion of the PA/LD 102 receives the electrical data signal from the host 111 via the signal path 102B, and drives the laser or light source within the TOSA 20. One example of a light source is a DML or a VCSEL that causes the TOSA 20 to emit onto the fiber 110B optical data signals representative of the information in the electrical data signal provided by the host 111.

The behavior of the ROSA 10, the PA/LD 102, and the TOSA 20 may vary dynamically due to a number of factors. For example, temperature changes, power fluctuations, and feedback conditions may each affect the performance of these components. Accordingly, the transceiver 100 includes a control module 105, which may evaluate environmental conditions, such as temperature, age of the laser, and/or operating conditions, such as voltage or bias current, and receive information from the post-amplifier portion of the PA/LD 102 by way of connection 105A, and from the laser driver portion of the PA/LD by way of connection 105B. This arrangement allows the control module 105 to optimize the performance of the laser to compensate for dynamically varying conditions.

Specifically, the control module 105 optimizes the operation of the transceiver 100 by adjusting settings on the PA/LD 102 as represented by the connections 105A and 105B. These settings adjustments can be intermittent and are generally only made when temperature or voltage or other low frequency changes so warrant. For example, the control module may include sensors that allow it to monitor and measure the laser bias current provided by the laser driver portion of PA/LD 102. In some embodiments, the control module may include an analog-to-digital converter (ADC) that would allow it to receive analog signals from the laser driver portion of PA/LD 102 and then convert these signals to digital signals. This allows control module 105 to use connection 105B to direct the laser driver portion of PA/LD 102 to adjust the laser bias current up or down as needed.

The control module 105 has access to a persistent memory 106, which in one embodiment, is an Electrically Erasable and Programmable Read Only Memory (EEPROM). Persistent memory 106 may also be any other non-volatile memory source. Persistent memory 106 is used to store microcode for configuring control module 105 and for storing operational parameters that have been measured by the control module 105. The persistent memory 106 and the control module 105 may be packaged together in the same package or in different packages without restriction.

Data and clock signals may be provided from the host 111 to the control module 105 using the SDA and SCL lines respectively. Also data may be provided from the control module 105 to the host 111 to allow for transmitting diagnostic data such as environmental and/or operational parameters. The control module 105 includes both an analog portion 108 and a digital portion 109. In this example, the analog portion 108 and the digital portion 109 collectively enable the control module to implement logic digitally, while still largely interfacing with the rest of the optical transceiver 100 using analog signals.

Figure 2:
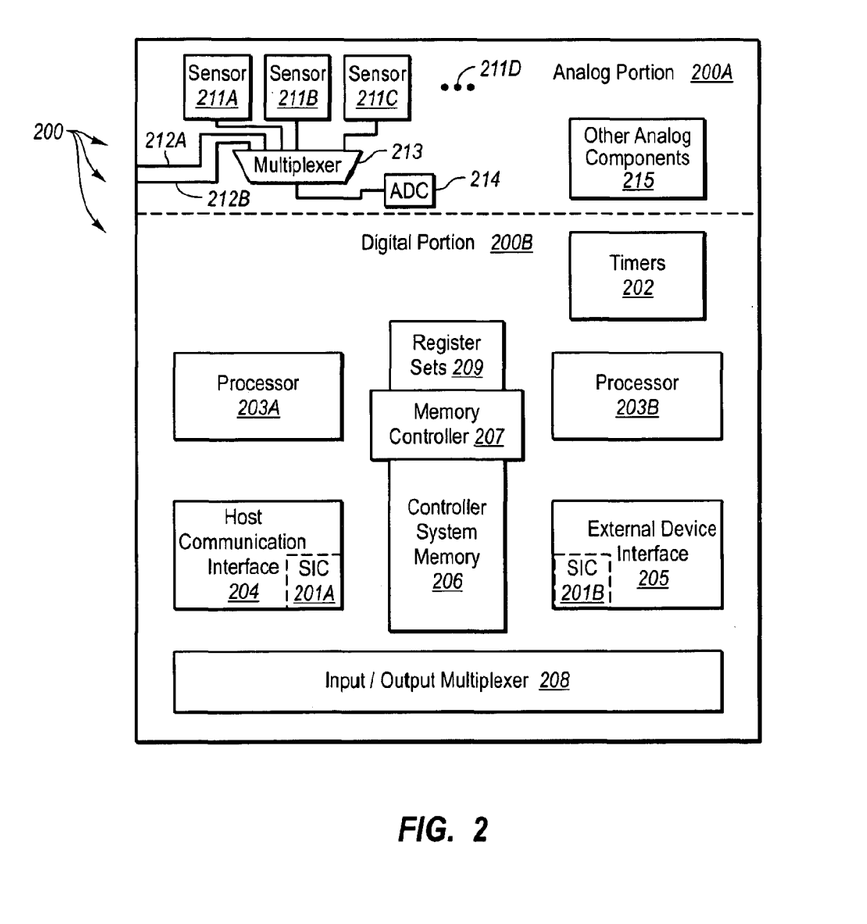
FIG. 2 schematically illustrates an example of the control module of FIG. 1B.

FIG. 2 schematically illustrates an example 200 of the control module 105A in further detail. The control module 200 includes an analog portion 200A that represents an example of the analog portion 108 of FIG. 1, and a digital portion 200B that represents an example of the digital portion 109 of FIG. 1.

For example, the analog portion 200A may contain digital to analog converters, analog to digital converters, high speed comparators (e.g., for event detection), voltage based reset generators, voltage regulators, voltage references, clock generator, and other analog components. For example, the analog portion 200A includes sensors 211A, 211B, 211C amongst potentially others as represented by the horizontal ellipses 211D. Each of these sensors may be responsible for measuring operational parameters that may be measured from the control module 200 such as, for example, supply voltage, bias current or voltage, and transceiver temperature. The control module may also receive external analog or digital signals from other components within the optical transceiver that indicate other measured parameters such as, for example, laser bias current, transmit power, receive power, laser wavelength, laser temperature, and Thermo Electric Cooler (TEC) current. Two external lines 212A and 212B are illustrated for receiving such external analog signals although there may be many of such lines.

The internal sensors may generate analog signals that represent the measured values. In addition, the externally provided signals may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage based reset generators, voltage regulators, voltage references, clock generator, and other analog components.

The digital portion 200B of the control module 200 may include a timer module 202 that provides various timing signals used by the digital portion 200B. Such timing signals may include, for example, programmable processor clock signals. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of the present invention as the instruction set may be optimized around a particular hardware environment, and as the precise hardware environment is not important to the principles of the present invention.

A host communications interface 204 is used to communicate with the host, possibly implemented using a two-wire interface such as I²C shown in FIG. 1 as the serial data (SDA) and serial clock (SCL) lines on the optical transceiver 10A. Other host communication interfaces may also be implemented as well. Data may be provided from the control module 105A to the host using this host communications interface to allow for digital diagnostics and readings of temperature levels, transmit/receiver power levels, and the like. The external device interface 205 is used to communicate with, for example, other modules within the optical transceiver 100A such as, for example, the post-amplifier 102A, the laser driver 103A, or the persistent memory 106A.

The internal controller system memory 206 (not to be confused with the external persistent memory 106A) may be Random Access Memory (RAM) or non-volatile memory. The memory controller 207 shares access to the controller system memory 206 amongst each of the processors 203A and 203B and with the host communication interface 204 and the external device interface 205. In one embodiment, the host communication interface 204 includes a serial interface controller 201A, and the external device interface 205 includes a serial interface controller 201B. The two serial interface controllers 201A and 201B may communicate using a two-wire interface such as I²C or another interface so long as the interface is recognized by both communicating modules. One serial interface controller (e.g., serial interface controller 201B) is a master component, while the other serial interface controller (e.g., serial interface controller 201A) is a slave component.

An input/output multiplexer 208 multiplexes the various input/output pins of the control module 200 to the various components within the control module 200. This enables different components to dynamically assign pins in accordance with the then existing operational circumstances of the control module 200. Accordingly, there may be more input\output nodes within the control module 200 than there are pins available on the control module 200, thereby reducing the footprint of the control module 200.

Register sets 209 contain a number of individual registers. These registers may be used by the processors 203 to write microcode generated data that controls high speed comparison in optical transceiver 10A. Alternatively, the registers may hold data selecting operational parameters for comparison. Additionally, the registers may be memory mapped to the various components of optical transceiver 100A for controlling aspects of the component such as laser bias current or transmit power.

Returning again to FIG. 1B, in some embodiments the TOSA 20 may include a heating element 21 that is configured to provide heat to the laser inside TOSA 20. As will be described in more detail to follow, the control module may control the amount of current provided to the heating element 21 via connection 105C. In some embodiments, the heating element 21 may be a heating resistor, while in other embodiments the heating element may be any other suitable heating device or circuit configured to heat a laser diode.

Figure 3:
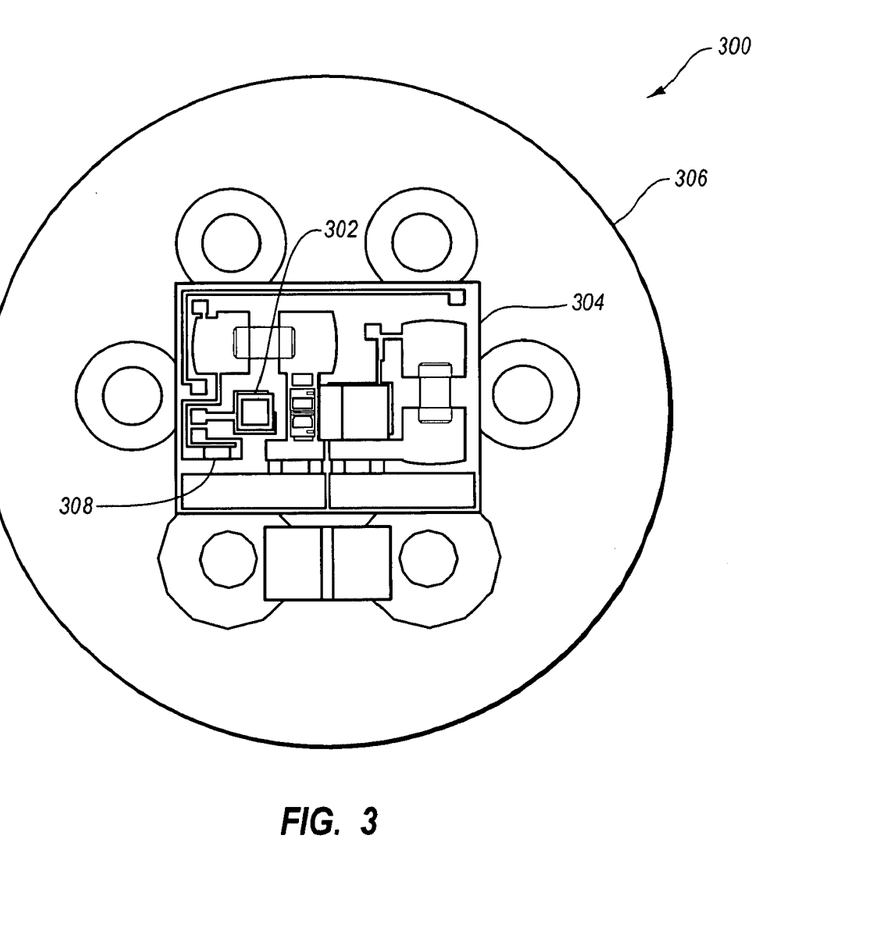
FIG. 3 schematically illustrates an example TOSA including a laser and a heating resistor.

FIG. 3 illustrates in more detail an embodiment of a TOSA, generally designated at 300, that includes a heating resistor. The TOSA 300 includes a laser 302. The laser 302 may be, for example, a distributed feedback (DFB) laser, an electro-absorption modulated laser (EML), a vertical cavity surface emitting laser (VCSEL) or other suitable optical device.

The laser 302 is mounted on a substrate 304. The substrate 304 is usable in creating a submount including the laser 302. The submount can be included in a TO can package illustrated at 306. The substrate 304 may be, for example, a ceramic substrate, silicon nitride substrate, a silicon dioxide substrate, or any other suitable substrate.

FIG. 3 further illustrates a heating resistor 308. The heating resistor 308 may be any suitable resistor. In one embodiment, the heating resistor 308 may be a thin-film resistor printed onto the substrate 304. For example, the thin film resister may be printed onto the substrate during a process for printing other traces and pads onto the substrate 304. In an alternative embodiment, the heating resistor may be a surface mount component. In yet another alternative embodiment, the heating resistor could be monolithically integrated with the laser itself.

Other embodiments may use other suitable components. In one particular embodiment, the heating resistor may be configured to be in the 5 to 100 Ohm range, preferably 15 Ohms, when used with a 3V power source. This provides power dissipation of about 90-900 mW. In particular, it has been noted that in some embodiments, a 1° C. temperature rise can be obtained for every 10 mW of electrical power generated by the heating resistor 308. Thus, using 300 mW, the operating temperature of the laser 302 can be raised 30° C. Thus, in an embodiment where the laser is optimized for −10° C. to 90° C., a TOSA 300 can be implemented that operates from −40° C. to 90° C. by activating the heating resistor 308 when ambient temperatures are below −10° C. Power dissipation of the heating resistor 308 can be controlled such that an appropriate temperature change is achieved as will be described in more detail to follow.

As described above, an optical transceiver module such as transceiver 100 is susceptible to changes in its operating environment. For example, as the temperature of the transceiver changes, the operation of the laser in TOSA 20 will change. That is, when the temperature falls, less laser bias current is needed to maintain a desired optical output power level while more laser bias current is needed when the temperature rises to maintain the desired optical output power level. Accordingly, it is common for optical transceiver modules to implement an automatic power feedback loop that forces the laser bias current to adjust with changes in temperature. The transceiver is calibrated so that the laser bias current for a given temperature over a range of temperatures is ascertained. This information is then made available to the automatic power feedback loop. The automatic power feedback loop, which includes the control module 105 and the laser driver, constantly monitors the temperature. When the temperature changes, the control module causes the laser driver to adjust the laser bias current to a level that corresponds to the given temperature. In this way, a constant optical output power is achieved regardless of temperature.

In some applications, it is often necessary or desirable to operate the transceiver module 100 at a temperature that is lower than the temperature rating of the laser implemented in the module. For example, in some embodiments the laser may be optimized for −10° C. to 90° C., while the optical module needs to operate at −40° C. to 90° C. In such circumstances, a heater such as heater 21 may be implemented to ensure that the laser's temperature is maintained at an acceptable level.

However, when implementing the heater 21, it may be necessary to provide current control for the heater. Several different solutions have been implemented. For example, one solution has been to place a temperature sensor in the TOSA 20 and then to build a table of heater current vs. TOSA temperature. Another solution has been to run an open feedback loop system that builds a heater current versus case temperature table. As the temperature changes, the current to the heater is adjusted. While both of these methods have proven useful, they require that an additional sensor such as a thermistor be implemented with the laser. Implementing the thermistor can be expensive and difficult to implement.

Other solutions include using a wavelength locker such as are used in DWDM system. However, such systems are also not ideal as wavelength lockers are very expensive.

Advantageously, the principles of the present invention provide for a closed loop system for controlling the laser temperature without the need for additional sensors or other hardware. Embodiments of the present invention utilize the existing automatic power feedback loop and existing sensors to determine the temperature of a TOSA, based on changes in laser bias current, thus avoiding the need for the additional hardware. As mentioned previously, the automatic power feedback loop will modify the laser bias current as the temperature of the TOSA changes. That is, as the temperature increases, the amount of laser bias current is increased and as the temperature decreases, the amount of laser bias current is decreased. Thus, the laser bias current may be used as feedback for the laser temperature control. Accordingly, when the transceiver module drops below a preset temperature, the laser heater current may be controlled to maintain the same laser bias current as at the preset temperature.

Figure 4:
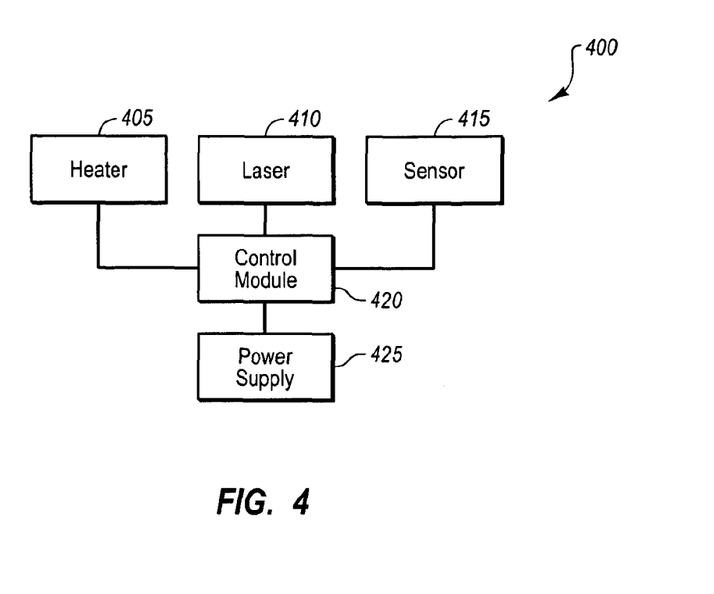
FIG. 4 schematically illustrates a portion of an optical transceiver module.

Reference is now made to FIG. 4, which illustrates a portion of a transceiver module 400, which may correspond to the module 100. As shown, the module 400 includes a heater 405, a laser 410, a sensor 415, a control module 420, and a power supply 425.

The sensor 415 may correspond to the sensors 211 which reside in the control module, or it may correspond to a sensor that is placed elsewhere in the transceiver module, such as in the laser driver portion of PA/LD 102 or in the TOSA 20. In operation, the sensor 415 is configured to measure the bias current value provided by the automatic power feedback loop to the laser 410 when the laser is at 25 degrees Celsius. This value is then recorded in a memory such as persistent memory 106 that is accessible by the control module 420. Although 25 degrees Celsius (i.e., room temperature) will be used in the example embodiment, it will be appreciated that the laser bias current may be measured and recorded for any desired temperature The sensor 415 continues to monitor the laser bias current being provided to the laser 410. As mentioned, as the temperature begins to change so will the bias current. The sensor 415 may notify the control module 420 when the laser bias current has changed. The control module 420, which may correspond to the control module 200, may then determine if the laser bias current has fallen below the laser bias value recorded at 25 degrees Celsius.

Figure 5:
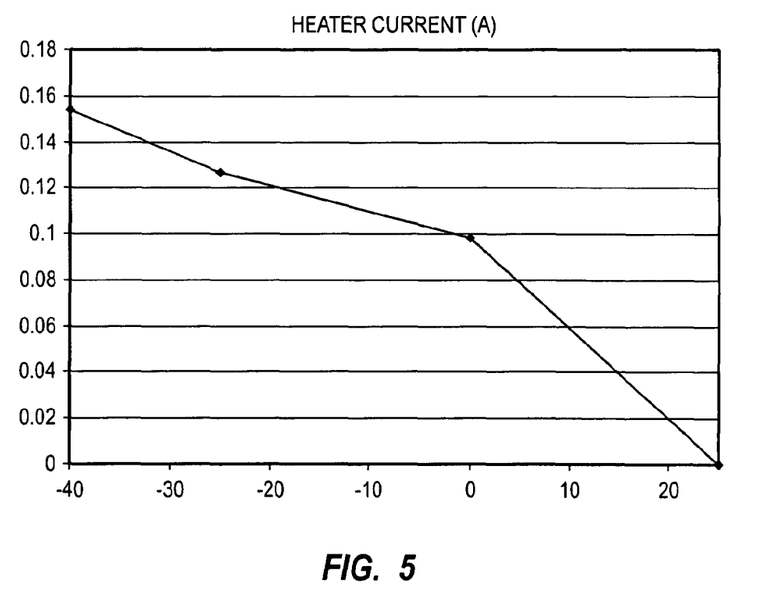
FIG. 5 illustrates a plot showing heater current versus temperature.

As illustrated, the control module 420 powers the heater 405 from the power supply 425. When the control module 420 determines that the laser bias current has fallen below the laser bias current measured and recorded at 25 degrees Celsius, thus indicating that the temperature of the TOSA has fallen, the control module sends current to or turns on the heater 405. As described above, the heater 405, which may correspond to the resistor heater 308, is configured to heat the laser 410. As will be appreciated, as the current that is provided to the heater 405 increases, the amount of heat it provides to laser 410 will also increase. Thus, for lower temperatures, a greater amount of current is needed by heater 405 in order to maintain a desired temperature, such as 25 degrees Celsius. This is further illustrated in FIG. 5, which shows heater current versus temperature. As the temperature decreases, the amount of heater current needed for the heater to maintain 25 degrees Celsius increases.

As the temperature of the laser increases, the automatic power feedback loop will begin to increase the laser bias current. In turn, this will be detected by sensor 415 and provided to control module 420. When the laser bias current is again at the 25 degrees Celsius value, the control module 420 will cause that the current level being provided to heater 405 is maintained to thereby maintain the laser bias current at the 25 degrees Celsius level.

This process will continually be repeated throughout operation of the transceiver module 400. Anytime that a change in laser bias current detected by sensor 415 indicates that the temperature has fallen, the control module 420 will cause that the current being provided the heater 405 is increased until the laser bias current returns to its value at 25 degrees Celsius, thus indicating that the laser is likely at room temperature. Likewise, if a change in laser bias current detected by sensor 415 indicates that the temperature has increased, the control module 420 will cause that the current being provided the heater 405 is decreased until the laser bias current returns to its value at 25 degrees Celsius. It will appreciated that if the sensors 415 and the control module 420 determine that the laser bias current is above the 25 degrees Celsius value, then the control module 420 will cause that current to the heater 405 is turned off as the laser will not need to be heated.

Accordingly, the principles of the present invention enable a laser to operate while the temperature of the module drops below the normal operating temperature of the laser. For example, a VCSEL normally operates to specification down to about −10 degrees Celsius. However, with the heater and control of the present invention, the VCSEL may be used in a transceiver module that operates at about −40 degrees Celsius. In addition, since there is some yield loss in many lasers while testing for low temperature performance (<10 degrees Celsius), the principles of the present invention improves yield of lasers for acceptable module use. Further, the power efficiency of a transceiver module is independent of the heater value because the heating current is limited by the controller as explained.

Figure 6:
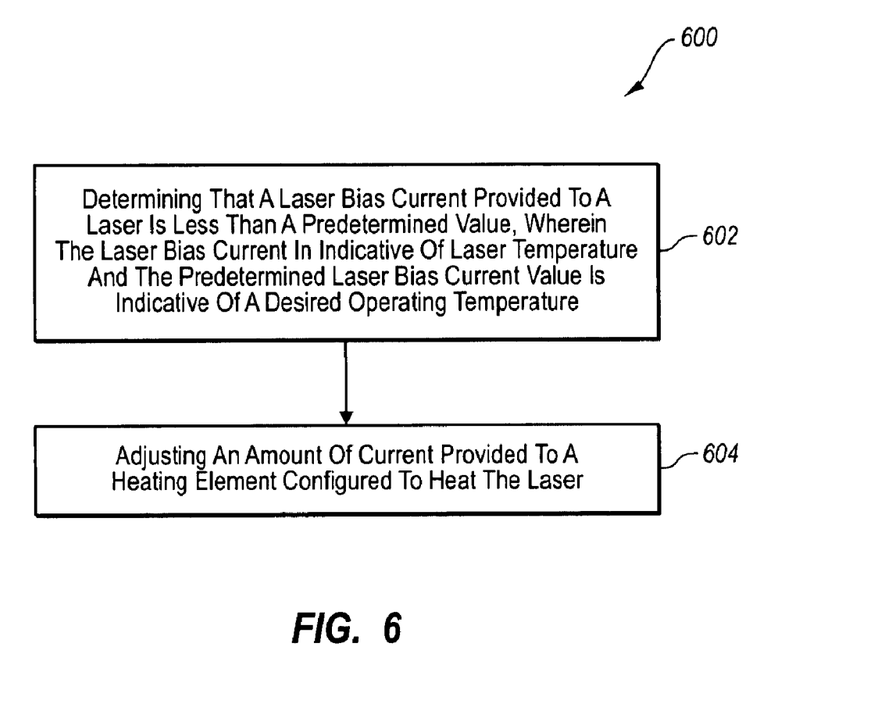
FIG. 6 illustrates a flow chart of a method for controlling the temperature of a laser in accordance with embodiments disclosed herein.

Attention is now made to FIG. 6, which illustrates a method 600 for an optical transceiver to control the temperature of a laser. The method will be described in relation to FIGS. 1, 2, 3, and 4. Of course, one of skill in the art will appreciate that method 600 may be performed in numerous other environments as circumstances warrant.

Method 600 includes determining 602 that a laser bias current provided to a laser is less than a predetermined value, wherein the laser bias current is indicative of laser temperature and the predetermined laser bias current value is indicative of a desired operating temperature. For example, as previously described, the sensor 415 and the control module 420 may determine the laser bias current value at a desired operating temperature such as 25 degrees Celsius. This value may then be stored in persistent memory 106. Thus, the bias current value at 25 degrees Celsius is indicative of that temperature. As mentioned previously, the bias current may act as a feedback to control temperature as thus is indicative of the laser temperature.

The method 600 also includes adjusting 602 an amount of current provided to a heating element configured to heat the laser. As described, when the sensor 415 and the control module 420 determine that the laser bias current has fallen below the predetermined value, the control module 420 may cause that current is provided to the heater 405. The amount of current provided will depend on the module temperature. The adjusting of the current provided to the heating element will continue until it is determined that the laser bias current is at the predetermined value, at which time the control module will hold the current constant until another change in the laser bias current is measured.

This process will continually be repeated throughout operation of the transceiver module 400. Anytime that a change in laser bias current detected by sensor 415 indicates that the temperature has fallen, the control module 420 will cause that the current being provided the heater 405 is increased until the laser bias current returns to its value at 25 degrees Celsius, thus indicating that the laser is likely at room temperature. Likewise, if a change in laser bias current detected by sensor 415 indicates that the temperature has increased, the control module 420 will cause that the current being provided the heater 405 is decreased until the laser bias current returns to its value at 25 degrees Celsius. It will appreciated that if the sensors 415 and the control module 420 determine that the laser bias current is above the 25 degrees Celsius value, then the control module 420 will cause that current to the heater 405 is turned off as the laser will not need to be heated.

Although the embodiments previously described have indicated that the laser bias current generally goes down with laser temperature going down and vice versa, this need not always be the case. As will be appreciated, as long as the relationship between laser temperature and laser bias current is predictable and monolithic, then the principles of the present invention are applicable. That is as long as the laser temperature changes in a predictable manner with changes in laser bias current, then the laser bias current may be used as feedback that is indicative of the laser temperature.

Accordingly, in one embodiment the control module 420 may be configured to ascertain a relationship between the temperature of laser 410 and the laser bias current that is provided to the laser. The relationship may correspond to the relationship previously described in that the laser bias current generally goes down with laser temperature going down. However, the relationship may be the opposite in that the laser bias current will generally go down as laser temperature going up. One of skill in the art will appreciate that any relationship between laser bias current and laser temperature is contemplated by the principles of the present invention.

Once the relationship is known, then the temperature of the laser 410 may be ascertained by measuring the bias current with the sensor 415. That is, the control module 420 is able to determine the current temperature of the laser based on the laser current bias value. If the laser bias current value indicates that the laser 410 temperature is not at a desired temperature, the control module may cause that current be provided to the heater 405 or that current being provided to the heater is adjusted or turned off until a laser bias current value is measured that corresponds to or is indicative of the desired laser operating temperature. As will be appreciated, as the temperature of the laser 410 changes, the amount of laser bias current being provided will change in accordance with the relationship between the laser temperature and the laser bias current. In the way, the laser bias current may be used to set the laser temperature.

Embodiments include general-purpose and/or special-purpose devices or systems that include both hardware and/or software components. Embodiments may also include physical computer-readable media and/or intangible computer-readable media for carrying or having computer-executable instructions, data structures, and/or data signals stored thereon. Such physical computer-readable media and/or intangible computer-readable media can be any available media that can be accessed by a general purpose or special purpose computer. By way of example, and not limitation, such physical computer-readable media can include RAM, ROM, EEPROM, CD-ROM or other optical disk storage, magnetic disk storage or other magnetic storage devices, other semiconductor storage media, or any other physical medium which can be used to store desired data in the form of computer-executable instructions, data structures and/or data signals, and which can be accessed by a general purpose or special purpose computer. Within a general purpose or special purpose computer, intangible computer-readable media can include electromagnetic means for conveying a data signal from one part of the computer to another, such as through circuitry residing in the computer.

When information is transferred or provided over a network or another communications connection (either hardwired, wireless, or a combination of hardwired and wireless) to a computer, hardwired devices for sending and receiving computer-executable instructions, data structures, and/or data signals (e.g., wires, cables, optical fibers, electronic circuitry, chemical, and the like) should properly be viewed as physical computer-readable mediums while wireless carriers or wireless mediums for sending and/or receiving computer-executable instructions, data structures, and/or data signals (e.g., radio communications, satellite communications, infrared communications, and the like) should properly be viewed as intangible computer-readable mediums. Combinations of the above should also be included within the scope of computer-readable media.

Computer-executable instructions include, for example, instructions, data, and/or data signals which cause a general purpose computer, special purpose computer, or special purpose processing device to perform a certain function or group of functions. Although not required, aspects of the invention have been described herein in the general context of computer-executable instructions, such as program modules, being executed by computers, in network environments and/or non-network environments. Generally, program modules include routines, programs, objects, components, and content structures that perform particular tasks or implement particular abstract content types. Computer-executable instructions, associated content structures, and program modules represent examples of program code for executing aspects of the methods disclosed herein.

Embodiments may also include computer program products for use in the systems of the present invention, the computer program product having a physical computer-readable medium having computer readable program code stored thereon, the computer readable program code comprising computer executable instructions that, when executed by a processor, cause the system to perform the methods of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transceiver module comprising:
   a module housing;
   a printed circuit board at least partially positioned inside the module housing;
   a receiver optical subassembly (ROSA) at least partially positioned inside the module housing; and
   a transmitter optical subassembly (TOSA) at least partially positioned inside the module housing, the TOSA comprising:
      a TOSA package;
      a laser positioned inside the TOSA package;
      a sensor configured to monitor an amount of laser bias current provided to the laser without directly monitoring the temperature of any portion of the optical transceiver module;
      a heating element positioned inside the TOSA package and configured to heat the laser; and
      control circuitry coupled to the heating element and the sensor,
   wherein the control circuitry is configured to:
      determine a relationship between the temperature of the laser and the laser bias current provided to the laser,
      adjust an amount of current provided to the heating element when a reading from the sensor indicates that the laser bias current being provided to the laser is below a value that the temperature to bias current relationship associates with a desired temperature, and
      adjust the amount of current provided to the heating element without input from a temperature sensor that directly monitors the temperature of at least a portion of the optical transceiver module, and wherein providing current to the heating element causes a change in the operating temperature of the laser.

2. The optical transceiver in accordance with claim 1, wherein the laser is disposed on a substrate that is positioned inside the TOSA package and the heating element is disposed on the substrate with the laser.

3. The optical transceiver in accordance with claim 1, wherein the heating element comprises at least one of a printed film resistor, a surface mount resistor, or a resistor monolithically integrated with the laser.

4. The optical transceiver in accordance with claim 3, wherein the heating element is a resistor between 5 and 100 Ohms.

5. The optical transceiver in accordance with claim 1, wherein the sensor is included within the control circuitry.

6. The optical transceiver in accordance with claim 1, wherein the laser comprises a vertical cavity surface emitting laser (VCSEL).

7. The optical transceiver in accordance with claim 1, wherein the control circuitry is further configured to not cause current to be provided to the heating element when the sensor determines that the laser bias current being provided to the laser is above the value associated with the desired temperature.

8. The optical transceiver in accordance with claim 1, wherein the control circuitry continues to adjust the amount of current provided to the heating element as long as the bias current is below the value associated with the desired temperature, wherein more current is provided to the heating element the farther the laser bias current is from the value associated with the desired temperature.

9. A method for an optical transceiver to control the temperature of a laser, the method comprising:
determining a relationship between the temperature of the laser that is positioned inside a TOSA package and a laser bias current provided to the laser;
determining that a laser bias current provided to a laser is less than a value that the temperature to bias current relationship associates with a desired operating temperature; and
adjusting an amount of current provided to a heating element that is positioned inside the TOSA package with the laser and that is configured to heat the laser based on the determination that the laser bias current is less than the value associated with the desired operating temperature and not based on a direct monitoring of the temperature of at least a portion of the optical transceiver module.

10. The method in accordance with claim 9, wherein adjusting an amount of current provided to a heating element comprises:
determining that a change in the laser bias current provided to the laser is indicative of a fall in module temperature; and
in response, increasing the amount of current provided to the heating element, the increase in current causing the heating element to heat the laser.

11. The method in accordance with claim 9, wherein adjusting an amount of current provided to a heating element comprises:
determining that a change in the laser bias current provided to the laser is indicative of a rise in module temperature; and
in response, decreasing the amount of current provided to the heating element.

12. The method in accordance with claim 9, wherein adjusting an amount of current provided to a heating element comprises:
adjusting the current provided to the heating element until it is determined that the laser bias current is at the value associated with the desired operating temperature.

13. The method in accordance with claim 9, wherein the laser is disposed on a substrate that is positioned inside the TOSA package and the heating element is disposed on the substrate with the laser.

14. The method in accordance with claim 13, wherein the heating element comprises at least one of a printed film resistor, a surface mount resistor, or a resistor monolithically integrated with the laser.

15. The method in accordance with claim 9, wherein the sensor is included within a control module configured to adjust the amount of current provided to the heating element.

16. The method in accordance with claim 9, wherein the laser comprises a vertical cavity surface emitting laser (VCSEL).

17. An optical transceiver module comprising:
a module housing;
a printed circuit board at least partially positioned inside the module housing;
a receiver optical subassembly (ROSA) at least partially positioned inside the module housing; and
a transmitter optical subassembly (TOSA) at least partially positioned inside the module housing, the TOSA comprising:
a TOSA package;
a laser positioned inside the TOSA package;
a sensor configured to monitor an amount of laser bias current provided to the laser without directly monitoring the temperature of any portion of the optical transceiver module;
a heating element positioned inside the TOSA package and configured to heat the laser;
a control module coupled to the heating element and the sensor, wherein the control module is configured to:
determine a relationship between the temperature of the laser and a laser bias current that is provided to the laser;
determine that the laser is not at a desired operating temperature based solely on a measured laser bias current value from the sensor and the relationship between the temperature of the laser and laser bias current that is provided to the laser and not based on a direct monitoring of the temperature of at least a portion of the optical transceiver module; and
cause that a current to the heating element be adjusted to thereby change the temperature of the laser until a laser bias current value is measured that indicates that the laser is at the desired operating temperature.

18. The optical transceiver in accordance with claim 17, wherein the laser is disposed on a substrate that is positioned inside the TOSA package and the heating element is disposed on the substrate with the laser.

19. The optical transceiver in accordance with claim 18, wherein the heating element comprises at least one of a printed film resistor, a surface mount resistor, or a resistor monolithically integrated with the laser.

20. The optical transceiver in accordance with claim 17, wherein the sensor is included within the control module.

* * * * *